| (12) | United States Patent | (10) Patent No.: | US 10,777,273 B2 |
|---|---|---|---|
| | Das et al. | (45) Date of Patent: | *Sep. 15, 2020 |

(54) CROSS-POINT STORAGE ARRAY INCLUDING CORRELATED ELECTRON SWITCHES

(71) Applicant: Arm Limited, Cambridge (GB)

(72) Inventors: Shidhartha Das, Upper Cambourne (GB); James Edward Myers, Bottisham (GB); Seng Oon Toh, Riverside (GB)

(73) Assignee: Arm LTD, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/781,961

(22) PCT Filed: Nov. 29, 2016

(86) PCT No.: PCT/GB2016/053743
§ 371 (c)(1),
(2) Date: Jun. 6, 2018

(87) PCT Pub. No.: WO2017/098209
PCT Pub. Date: Jun. 15, 2017

(65) Prior Publication Data
US 2018/0366193 A1    Dec. 20, 2018

(30) Foreign Application Priority Data

Dec. 11, 2015 (GB) ................................. 1521879.5

(51) Int. Cl.
*G11C 13/00* (2006.01)
*G11C 7/06* (2006.01)
(Continued)

(52) U.S. Cl.
CPC .......... *G11C 13/0069* (2013.01); *G11C 7/067* (2013.01); *G11C 13/004* (2013.01);
(Continued)

(58) Field of Classification Search
None
See application file for complete search history.

(56) References Cited

U.S. PATENT DOCUMENTS 7,778,063 B2 *    8/2010   Brubaker ............ H01L 27/2409
                                                                 365/148
10,056,143 B2 *   8/2018   Shifren .............. G11C 13/0069
(Continued)

FOREIGN PATENT DOCUMENTS

JP    2005 317787    11/2005
JP    2008 034641     2/2008
(Continued)

OTHER PUBLICATIONS

GB1521879.5, Combined Search and Examination Report, GB Intellectual Property Office, dated Feb. 23, 2016.
(Continued)

*Primary Examiner* — J. H. Hur
(74) *Attorney, Agent, or Firm* — Leveque IP Law, P.C.

(57) ABSTRACT

A device comprising a storage array, the storage array comprising a first signal line and a second signal line, at least one correlated electron switch in electrical communication with the first signal line and the second signal line, and control circuitry for driving the correlated electron switch with at least one programming signal.

5 Claims, 7 Drawing Sheets

(51) Int. Cl.
*H01L 27/24* (2006.01)
*H01L 45/00* (2006.01)

(52) U.S. Cl.
CPC ...... *G11C 13/0007* (2013.01); *G11C 13/0026* (2013.01); *G11C 13/0028* (2013.01); *G11C 13/0033* (2013.01); *G11C 13/0097* (2013.01); *H01L 27/2463* (2013.01); *H01L 45/1233* (2013.01); *H01L 45/1253* (2013.01); *H01L 45/1608* (2013.01); *G11C 2013/009* (2013.01); *G11C 2213/31* (2013.01); *G11C 2213/32* (2013.01); *G11C 2213/77* (2013.01); *H01L 45/146* (2013.01); *H01L 45/147* (2013.01)

(56) References Cited

U.S. PATENT DOCUMENTS

| | | | | |
|---|---|---|---|---|
| 2003/0193830 | A1* | 10/2003 | Baker | G11C 11/16 365/225.5 |
| 2005/0041467 | A1 | 2/2005 | Chen | |
| 2007/0015328 | A1* | 1/2007 | Hsu | H01L 29/66143 438/250 |
| 2008/0106926 | A1 | 5/2008 | Brubaker et al. | |
| 2008/0180989 | A1 | 7/2008 | Baek et al. | |
| 2010/0283028 | A1* | 11/2010 | Brubaker | H01L 27/2409 257/2 |
| 2013/0285699 | A1* | 10/2013 | McWilliams | H03K 19/173 326/41 |

FOREIGN PATENT DOCUMENTS

| | | |
|---|---|---|
| JP | WO 2007/138646 | 10/2009 |
| WO | WO 2009/140299 | 11/2009 |
| WO | WO 2013/154564 | 10/2013 |

OTHER PUBLICATIONS

PCT/GB2016/053743, International Search Report and Written Opinion, EPO, dated Apr. 13, 2017.
GB1521879.5, Corrected Combined Search and Examination Report, GB Intellectual Property Office, dated Dec. 14, 2016.

* cited by examiner

CROSS-POINT STORAGE ARRAY INCLUDING CORRELATED ELECTRON SWITCHES

RELATED PATENT APPLICATIONS

This patent application is a 35 U.S.C. 371 National stage U.S. patent application of PCT patent application PCT/GB2016/053743 with an International filing date of Nov. 29, 2016 claiming priority to GB patent application 1521879.5 filed on Dec. 11, 2015, the entire content of which is hereby incorporated by reference.

FIELD OF THE DISCLOSURE

The present techniques relate to a storage array. More particularly, the present techniques relate to a storage array comprising one or more correlated electron switches. Furthermore, the techniques relate to circuits and devices incorporating such correlated electron switches and methods of operation and manufacture thereof.

BACKGROUND

Non-volatile memory is a class of memory in which the memory cell or element does not lose its memory state after power supplied to the element is removed, and includes electrically erasable programmable read-only memory (EEPROM), flash memory, ferroelectric RAM (FeRAM), magnetic RAM (MRAM) to name but a few.

In flash memory, an ability to keep random access (erase/write single bits) was sacrificed for speed and higher bit density in comparison to EEPROMs. Flash memory remains a non-volatile memory of choice. Nevertheless, it is generally recognized that flash memory technology may not scale easily below 40 nanometers (nm).

Technologies considered for the replacement of, or for use in parallel with, flash memory have included resistance-based memory which is based on certain materials that exhibit a resistance change associated with a change of phase of the material (determined by the long range ordering of the atoms in the crystalline structure).

In one type of such resistance-based memory, called a phase change memory (PCM/PCRAM), a change in resistance occurs as the material of the memory element is melted briefly and then cooled to either a conductive crystalline state or an insulative amorphous state. However, resistance-based memories have not proved to be commercially useful because their transition between the conductive and the insulative states depends on a physical structure phenomenon, e.g. in a process of melting at up to 600° C. and returning to a solid state, whereby the process cannot be sufficiently controlled to be used as a reliable memory, and therefore is unsuitable for many applications.

Another resistance-based memory includes memory elements consisting of materials that respond to an initial high "forming" voltage and current to activate a variable resistance function. For example, the operation of resistive RAMs (ReRAMs) or conductive bridge RAMS (CBRAM) may be strongly temperature dependent, such that a resistive switching mechanism in a ReRAM/CBRAM may also be strongly temperature dependent. Certain types of ReRAM may also exhibit unstable qualities. Further, resistance switching in ReRAM/CBRAMs tends to fatigue over many memory cycles.

Thus, there remains a need for an improved non-volatile memory.

DESCRIPTION OF THE DRAWINGS

Embodiments will now be described with reference to the accompanying figures of which.

DETAILED DESCRIPTION

Figure 1A:
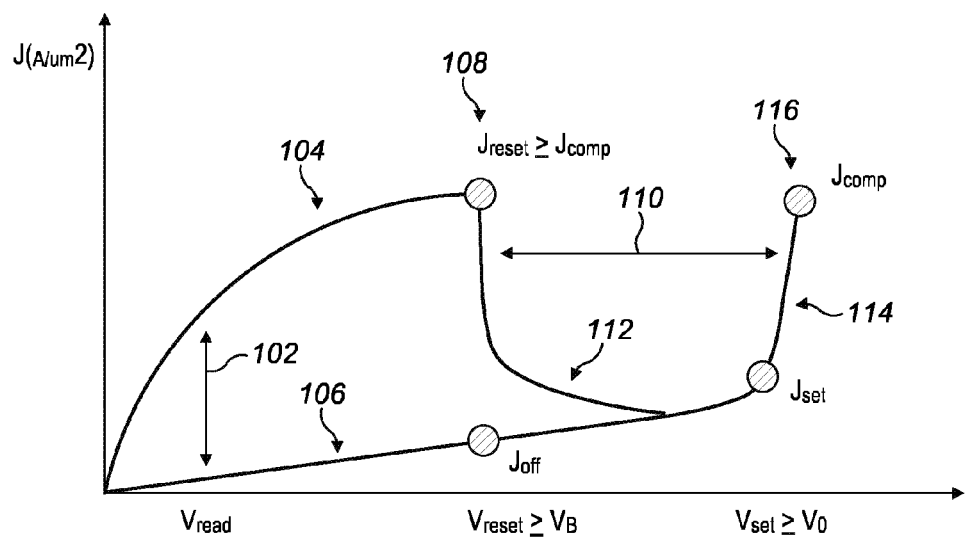
FIG. 1a shows a plot of current density against voltage for a correlated electron switch (CES) element.

According to a first technique, there is provided a device comprising a storage array, the storage array comprising a first signal line and a second signal line, at least one correlated electron switch in electrical communication with the first signal line and the second signal line, and control circuitry for driving the correlated electron switch with at least one programming signal.

According to a second technique, there is provided a method of fabricating a storage array having a correlated electron switch, the method comprising: selectively depositing first conductive material to form a first signal line on a substrate; forming the correlated electron switch on the first signal line; selectively depositing second conductive material atop the correlated electron switch to form a second signal line, wherein the correlated electron switch is provided in electrical communication with the first signal line and the second signal line.

According to a third technique, there is provided a storage array comprising: first signal lines; second signal lines, arranged at an angle with the first signal lines to form cross-points therewith; a plurality of correlated electron switches provided at the cross-points, wherein the correlated electron switches comprises correlated electron material, wherein the correlated electron material comprises a switching region, and wherein the memory state of a target correlated electron switch of the plurality of correlated electron switches is controllable or detectable by a programming signal from a control circuit via one or both of the first and second signal lines.

According to a fourth technique, there is provided a read-circuit for a read-target memory cell in a memory array, the read-circuit comprising a correlated electron switch element in a resistor ladder configuration with the read-target memory cell, wherein the resistor ladder configuration is configured to generate a first output value indicative of the memory state of the read-target memory cell.

Broadly speaking, embodiments of the present techniques provide a storage array and control circuitry for minimising parasitic sneak paths in non-target memory elements of the storage array. The storage array may comprise a memory array, whilst a storage element or cell in the memory array may be a non-volatile memory (NVM) element, such as a Correlated Electron Switch (CES) which comprises a correlated electron material (CEM).

The CES may be used both as non-volatile storage, as well as part of control circuitry to sense a state of a target CES element. As explained in more detail below, the CES element comprises a material that may transition between predetermined detectable memory states based at least in part on a transition of (at least a portion of) the material between a conductive state and an insulative state. The CES element is programmable such that it may store a configuration in a non-volatile manner, and use its impedance state to enable connectivity.

The term "correlated electron switch" is used interchangeably herein with "CES", "CES element", "CES device", "correlated electron random access memory", "CeRAM", and "CeRAM device".

A CES is a particular type of switch formed (wholly or in part) from a CEM. Generally speaking, a CES may exhibit an abrupt conductive or insulative state transition arising from electron correlations rather than solid state structural phase changes. (Examples of solid state structural phase changes include crystalline/amorphous in phase change memory (PCM) devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance (or capacitance) to low resistance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise CEM material sandwiched between conductive terminals. By applying a specific voltage and current between the terminals, the CEM material may transition between the aforementioned conductive and insulative states. As discussed in the particular example implementations below, CEM material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1a shows a plot of current density against voltage across terminals (not shown) for a CES element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$, required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CEM of CES element of FIG. 1a may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1a. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1a, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at a condition in a CES element in which a concentration of electrons n equals a concentration of electron holes p.

A current or current density in a region 104 of the plot shown in FIG. 1a may exist in response to injection of holes from a voltage signal applied across terminals of a CES element. Here, injection of holes may meet a Mott transition criterion for the conductive state to insulative state transition as a critical voltage is applied across terminals of CES element.

A "read window" 102 for detecting a memory state of a CES element in a read operation may be set out as a difference between a portion 106 of the plot of FIG. 1a while the CES element is in an insulative state, and a portion 104 of the plot of FIG. 1a while the CES element is in a conductive state at a read voltage $V_{read}$.

Similarly, a "write window" 110 for placing a CES element in an insulative or conductive memory state in a write operation may be set out as a difference between $V_{reset}$ (at reset) 112 and $V_{set}$ (at $J_{set}$) 114. Establishing $|V_{set}| > |V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device.

Figure 1B:
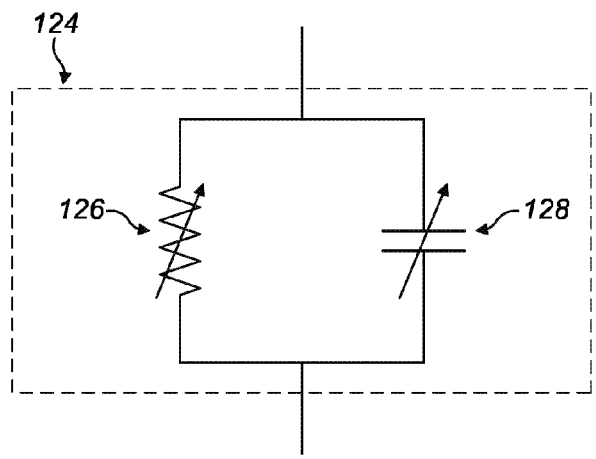
FIG. 1b is an example equivalent circuit for a correlated electron switch element.

FIG. 1b depicts a schematic diagram of an equivalent circuit of an example variable impeder device (such as a CES element), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Although the variable resistor 126 and variable capacitor 128 are depicted in FIG. 1b as discrete components, variable impeder device 124 may equally comprise a substantially homogenous CES element, wherein the CES element comprises characteristics of variable capacitance and variable resistance. Table 1 below depicts an example truth table for an example variable impedance device, such as variable impeder device 124.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Figure 2:
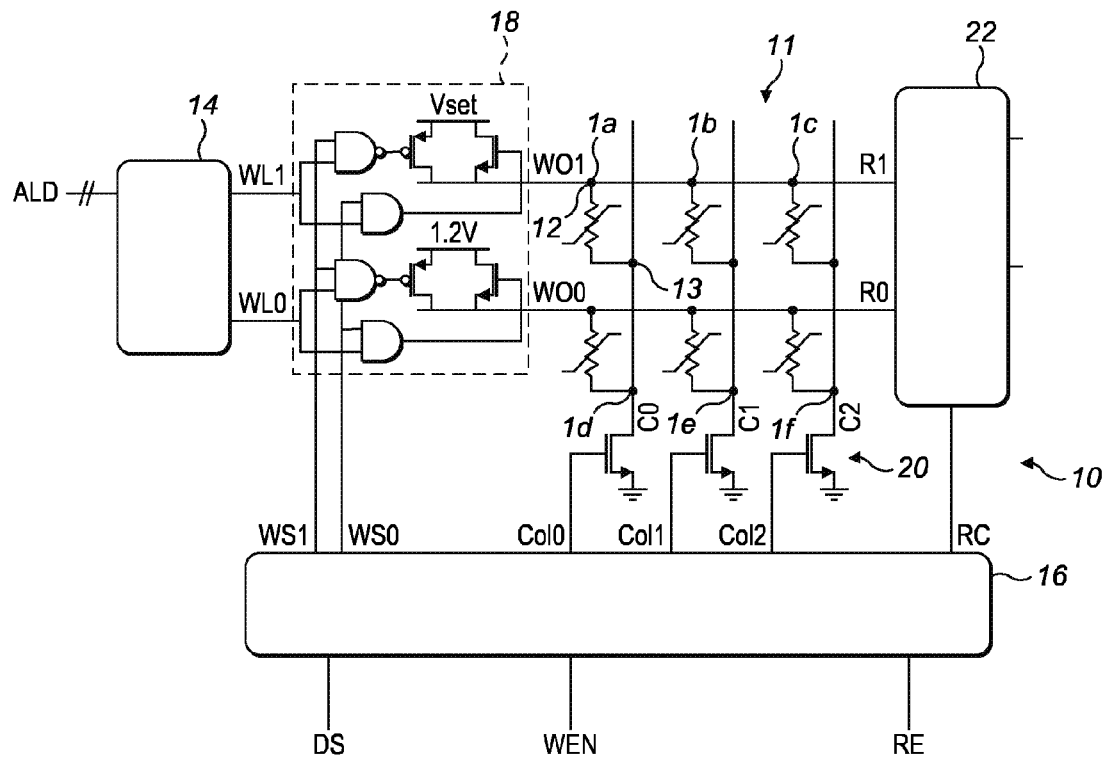
FIG. 2 is a schematic diagram showing a device having a cross-point memory array comprising correlated electron switches according to some embodiments.

FIG. 2 is a schematic diagram of a device 10 having a memory array 11 comprising storage cells in the form of correlated electron switches 1a-1f. The device 10 may comprise a memory device or other integrated circuit.

In FIG. 2, device 10 is depicted as comprising a cross-point memory array configuration, but that is only one example of different memory configurations; it is understood that several other configurations are possible.

FIG. 2 depicts a 2×3 cross-point memory array 11, having a matrix of signal lines and storage cells at the cross-points of the signal lines, whereby the signal lines are connected to control circuitry which may be used to control read and write operations with respect to the correlated electron switches 1a-1f. In the following embodiments the control circuitry is depicted as being provided at the periphery of the cross-point array, but may be provided in any suitable location or configuration.

In the present example, a first plurality of signal lines comprise row lines ($R_n$) (depicted as $R_0$ & $R_1$ in FIG. 2), whilst a second plurality of signal lines comprise column lines ($C_n$) (depicted as $C_0$, $C_1$ & $C_2$ in FIG. 2), whereby, storage cells, which in the following embodiments are CES elements 1a-1f, are arranged within the memory array 11.

Each CES element 1a-1f is depicted as having first terminals 12 and second terminals 13, whereby the first terminals 12 are connected to respective row lines $R_n$, whilst the second terminals 13 are connected to respective column lines $C_n$.

As an illustrative example, a first terminal 12 of CES element 1a of FIG. 2 is connected to row line $R_1$, whilst a second terminal 13 of CES element 1a is connected to column line $C_0$. As a further illustrative example, a first terminal 12 of CES element 1f is connected to row line $R_0$, whilst a second terminal 13 of CES element 1f is connected to column line $C_2$.

It will be appreciated that the CES elements 1a-1f are individually addressable by control circuitry via the respective row lines $R_n$ and column lines $C_n$, and an appropriate programming signal having a specific voltage (V) and/or current density (J) driven thereon by the control circuitry such that the memory state of the CES elements 1a-1f may be defined and/or sensed. Such memory states include an insulative or high impedance state (hereinafter "HIS") or a conductive or low impedance state (hereinafter "LIS").

Whilst the cross-point memory array of FIG. 2 is depicted as a 2×3 array (i.e. 2 row lines and 3 column lines) having six CES elements 1a-1f arranged therein, it will be appreciated that any suitable cross-point memory array r×c may be provided as required by a user or specific application, (whereby 'r' corresponds to the number of row lines whilst 'c' corresponds to the number column lines in the array). For example, in some examples, a 1×1 array may be provided. In alternative embodiments a 256×256, 512×512 or any suitable array may be provided.

In the present embodiment, the control circuitry includes address generation circuitry 14 for controlling the application of appropriate signals (e.g. programming signals) to the different row lines $R_n$.

In the present embodiment the address generation circuitry 14 comprises n-bit address line data (ALD). As will be understood to a person skilled in the art, the address generation circuitry may comprise a one-hot decoder that generates a "r" bit address output bus. Typically, for a n-bit address input a maximum of 2^n bits of decoded output lines are generated. As mentioned previously, the output bus is "one-hot". This indicates the fact that upon completion of the address decoding, only one line out of a maximum of 2^n lines is active. For example, assuming a 3-bit address bus, a maximum of 8 address lines (e.g. write-lines WL0 through to WL7) may be generated. Assuming that the input address bus is encoded as 101 (or binary encoding of decimal number 5), WL5 may be driven to an active logic state. The remaining decoder lines (WL0 to WL4 and WL6 to WL7) may all remain inactive. Typically, the active state is logic high. In the present embodiment, the respective write-line outputs ($WL_n$) are used as inputs to write circuitry 18 to determine how a particular row line ($R_n$) is to be driven, whereby write-lines $WL_0$ and $WL_1$ are depicted as decoded outputs which correspond to row lines $R_0$ and $R_1$ respectively.

In present embodiments, the write circuitry 18 comprises multiple write outputs (WOE) corresponding to the multiple row lines $R_n$, whereby each write output WOE drives a programming signal onto the respective row lines $R_n$ to effect a memory state change of one or more CES elements 1 therealong. The write circuitry 18 is described in greater detail in FIG. 3.

It will be appreciated that when a programming signal is applied to a respective row line $R_n$, a respective column line $C_n$ for one or more particular CES element(s) 1 may also be also controlled appropriately by the control circuitry. In the present example, the control circuitry comprises column control circuitry 16 for controlling the operation of the column lines $C_n$.

With reference to FIG. 2, and taking CES element 1b as the write-target CES element for the present example, when a programming signal e.g. ($V_{applied}$(at $J_{applied}$)) is driven onto $R_1$ to effect a memory state change on the write-target CES element 1b, the column line $C_1$ may be controlled by column control circuitry 16 as appropriate (e.g. pulled to zero or ground potential) as will be described below.

All other row lines (e.g. $R_0$) and/or column lines (e.g. $C_0$ & $C_2$) may be controlled such that the memory states of the other non-write-target CES elements (depicted in FIG. 2 as CES elements 1a & 1c-1f) are unaffected when the memory state of a write-target CES element is changed. As an example, the column lines $C_0$ and $C_2$ may be controlled by the column control circuitry 16 as appropriate (e.g. driven with high impedance or not connected to ground) to prevent current flow therethrough, and prevent an unwanted memory state change thereof. It will be understood that a write-target CES element may be any CES element which is to be addressed by a programming signal e.g. to change the memory state thereof.

In the present embodiment the column control circuitry 16 comprises a plurality of inputs including data state (DS); write enable low input (WEN), and read enable (RE).

The column control circuitry 16 also has a plurality of outputs including write state output lines (WS0 and WS1), a plurality of column control output lines ($Col_n$) and read circuitry control output line (RC).

In the present embodiment DS is an input (e.g. a binary input) whose value relates to or determines the value of WS output lines for one or more CES elements.

For example, when DS is high e.g. (logic '1'), then a logic '1' may be written to a particular CES element(s) (e.g. WS0=1; and WS1=0) to change the memory state of a CES element from a LIS to a HIS.

Alternatively, when DS is low (e.g. logic '0'), then a logic '0' may be written to a particular CES element(s) (e.g. WS0=0; and WS1=1) to change the memory state of a CES element from a HIS to a LIS.

In the present embodiment WEN is an input (e.g. a binary input) whose value relates to or determines whether a read or a write operation is to be performed on the one or more CES elements 1. For example, when WEN is low, the column control circuitry 16 may enable or disable further circuitry or logic to enable a write to a particular CES element(s) 1 to occur. When WEN is high, the column control circuitry 16 may enable or disable further circuitry or logic to enable a read from a particular CES element(s) 1 to occur.

For example, the column control circuitry 16 may control ($Col_n$) to enable or disable an appropriate column (e.g. using a transistor 20), which, in turn, enables or disables a particular column line $C_n$. e.g. by connecting the column lines $C_n$ to ground to enable current flow therethrough or driving a high impedance thereon to prevent current flow therethrough.

In the present embodiment RE is an input whose value relates to or determines whether all or portions of read circuitry 22 is enabled or disabled. For example, the value of RE may determine the value of RC which controls the functionality of read control circuitry (shown in FIG. 4), which, in turn, enables or disables the read circuitry 22.

In the present embodiments the read circuitry 22, which may be part of the control circuitry, is configured to detect the memory state of one or more read-target CES elements, by sensing or determining a value, symbol, parameter or condition etc. of the one or more CES elements. The read circuitry 22 is described in greater detail in FIG. 4. It will be understood that a read-target CES element is a CES element the memory state of which is desired to be detected.

Figure 3:
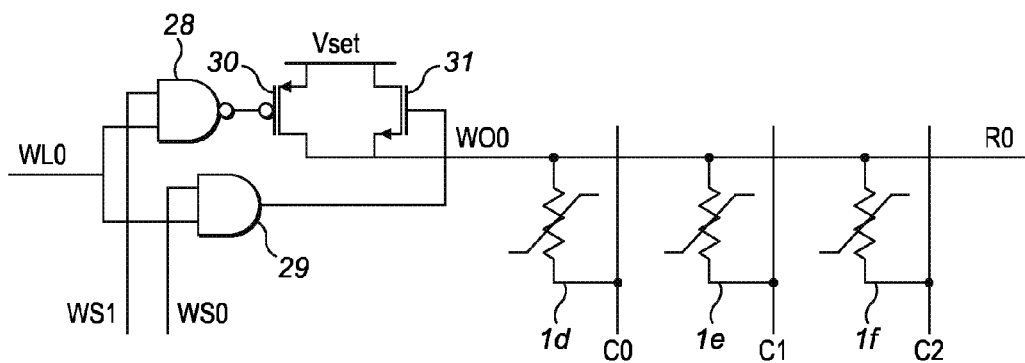
FIG. 3 is a schematic diagram showing control circuitry for the device of FIG. 2 according to some embodiments.

FIG. 3 is a schematic diagram showing control circuitry for the device 10 according to some embodiments. In particular, FIG. 3 is a schematic diagram showing write circuitry 18 for undertaking write operations with respect to the CES elements 1.

In the illustrative example of FIG. 3, the components for driving a single row line $R_0$ are depicted, whereby $WL_0$ and WS1 are arranged as inputs for NAND gate 28, whilst $WL_0$ and WS0 are arranged as inputs for AND gate 29.

The output of NAND gate 28 is arranged to, when at a low logic level (e.g. '0'), enable the PMOS transistor 30 and when at a high logic level, disable the PMOS transistor 30.

The output of AND gate 29 is arranged to, when at a high logic level (e.g. '1'), enable the NMOS transistor 31 and when at a low logic level, disable the NMOS transistor 31.

A single voltage $V_{set}$ is driven through the respective PMOS and NMOS transistors when enabled, whereby $V_{set}$ may be generated by appropriate circuitry, which may be part of the control circuitry. It will also be appreciated that the current and current density through each CES element 1 may also be controlled by appropriate circuitry, which may be part of the control circuitry.

When the PMOS transistor 30 is enabled, the output $WO_0$ from the write circuitry 18 is $V_{set}$.

However, a consequence of driving a logic '1' through the NMOS transistor 31 is that a voltage droop ($V_{set}$-$V_{threshold}$) results, such that when the NMOS transistor 31 is enabled, the output $WO_0 \approx (V_{set}-V_{threshold})$, whereby ($V_{set}$-$V_{threshold}) \geq V_{reset}$. For the purposes of the write-programming signal in present techniques ($V_{set}$-$V_{threshold}$) is taken to substantially correspond to $V_{reset}$.

The components of the write circuitry 18 used to drive $R_0$ may be repeated for all other row lines $R_n$ of the array. However, it will be appreciated that in some embodiments, the components used to drive all row lines are not required to be identical.

As above, different voltages and current densities are used to write the different memory states of a CES element.

In the present example, when writing a logic '0' to a write-target CES element in a HIS (when a LIS is required), the write circuitry 18 drives the first voltage $V_{set}$ onto the appropriate row line $R_n$, whilst the corresponding column line $C_n$ is pulled to zero or ground potential by the column control circuitry (not shown in FIG. 3) thereby effecting a memory state change of the write-target CES element from a HIS to a LIS.

In the present example, when writing a logic '1' to a write-target CES element in a LIS (when a HIS is required), the write circuitry 18 drives the second voltage ($V_{set}$-$V_{threshold}$), and therefore at least $V_{Reset}$, onto the appropriate row line $R_n$, whilst the corresponding column line $C_n$ is pulled to zero or ground potential by the column control circuitry (not shown in FIG. 3) thereby effecting a memory state change of the write-target CES element from the LIS to a HIS.

Furthermore, it will be appreciated that when a particular voltage is driven onto a respective row line $R_n$ to effect a desired memory state change in a write-target CES element 1, a corresponding current density (J(A/um$^2$)) is also controlled to achieve the desired memory state in the write-target CES element as required.

In the present embodiments, a combination of outputs from the respective address generation circuitry 14 and the column control circuitry 16 are used to generate the desired value for the write output ($WO_n$) from the write circuitry 18 for each row line ($R_n$).

With reference to the schematic example as depicted in FIG. 3, the decoded write-line output ($WL_0$) from the address generation circuitry 14 is combined with the (WS1) and (WS0) outputs from the column control circuitry to determine the value of $WO_0$ to be driven onto row line $R_0$.

As an illustrative example, if the desired value of $WO_0$ is '$V_{reset}$', then $WL_0$=1; WS1=0; and WS0=1.

In such a configuration, the output of NAND gate 28 is logic '1', whilst the output of AND gate 29 is also logic '1'. Therefore the PMOS transistor 30 is disabled, whilst the NMOS transistor 31 is enabled such that $WO_0$=$V_{reset}$.

As a further illustrative example, if the desired value of $WO_0$ is '$V_{set}$', then output $WL_0$=1; output WS1=1; and output WS0=0.

In such a configuration, the output of NAND gate 28 is logic '0', whilst the output of AND gate 29 is also logic '0'. Therefore the NMOS transistor 31 is disabled, whilst the PMOS transistor 30 is enabled such that $WO_0$=$V_{set}$.

As above, a corresponding column line can be pulled to zero or ground potential to effect the change in memory state of one or more of the write-target CES elements in the array.

Using the write circuitry 18 configuration herein described it is possible to obtain at least two voltages ($V_{set}$ & $V_{reset}$) from a single voltage source ($V_{set}$) using a combination of logic, thereby simplifying the operation and configuration of the control circuitry. In alternative embodiments, two or more voltage sources may be arranged to generate and drive different voltages onto the row lines.

Figure 4:
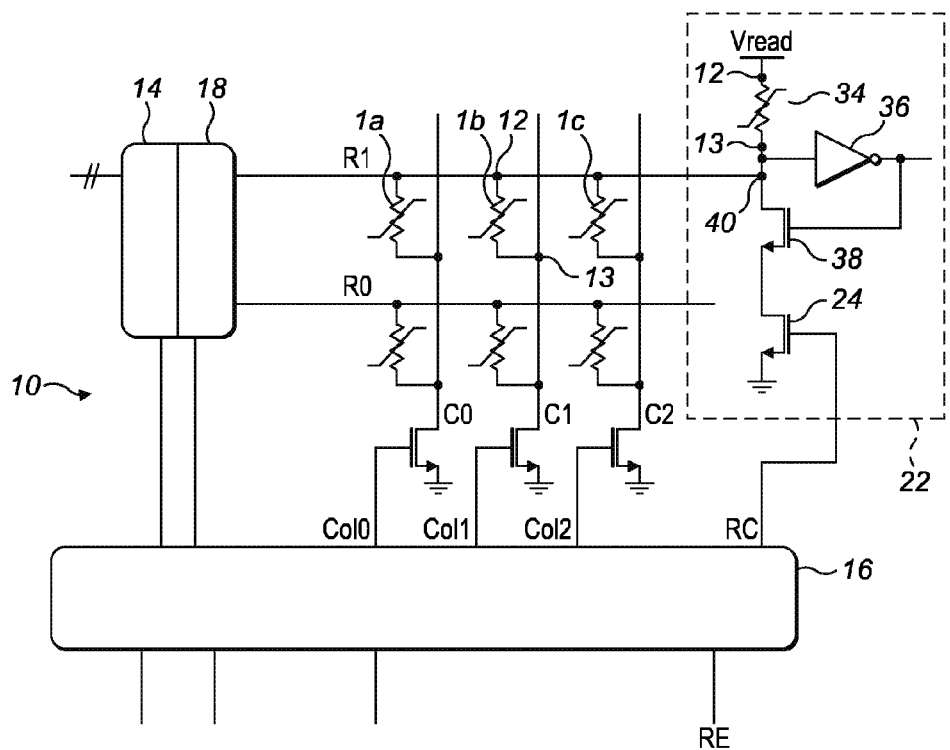
FIG. 4 is a schematic diagram showing control circuitry for the device of FIG. 2 according to some embodiments.

FIG. 4 is a schematic diagram showing control circuitry for the device 10 according to some embodiments. In particular, FIG. 4 is a schematic diagram showing components of read circuitry 22 for undertaking read operations with respect to the CES elements 1a-1c.

As with the write circuitry 18 described above in FIGS. 2 and 3, the read circuitry 22 comprises components associated with the individual row lines $R_n$, whereby only the read circuitry 22 for row line $R_1$ is depicted in FIG. 4.

The read circuitry 22 comprises a resistive element 34, whereby a first terminal of the resistive element 34 is connected to a voltage source arranged to generate a read-programming signal e.g. ($V_{read}$(at $J_{read}$)), whilst a second terminal 13 is connected to row line $R_1$, such that the resistive element 34 is arranged in a resistor ladder configuration with the CES elements of $R_1$, such that a voltage $V_{sense}$ of a read-target CES element may be sensed at intermediate node 40, whereby $V_{sense}$ is indicative of the memory state of the read-target CES element, such that the memory state of the read-target CES element may be detected.

It will be seen that detecting a memory state of a read-target CES element can be performed by the read circuitry 22, without any additional logic required to be added to the memory array 11 itself.

The resistive element 34 may also be connected to additional sensing circuitry, comprising a feedback loop, whereby, in the present embodiment a second terminal of the resistive element 34 is connected to an inverter 36, and is still further connected to a terminal of a transistor 38. An output of the inverter 36 is further connected to the gate of the transistor 38. The additional sensing circuitry is described in greater detail in FIG. 5.

It will be appreciated that in order to detect the memory state of a read-target CES element, the column line to which the read-target CES element is controlled by the column control circuitry 16 as appropriate (e.g. pulled to zero potential) to enable current to flow through the read-target CES element.

In the present example, the read-target CES element is depicted as CES element 1b having a first terminal 12 connected to $R_1$ and a second terminal 13 connected to $C_1$.

In the present embodiment, the resistive element 34 comprises a CES element in a LIS, however the resistive element 34 may comprise one or more resistors, having a resistance which matches that of the CES elements in the array when in a LIS.

For the purposes of this description, the resistance of a CES element in a LIS is taken to be in the order of, for example, 10 kΩ, whilst the resistance of a CES element in a HIS is taken be in the order of, for example, 10MΩ. It will however be appreciated that the resistance of a particular CES element in an LIS or HIS will be dependent on the characteristics of the materials of the CES elements. It will also be appreciated that there may be some variation between the resistances of CES elements in the same memory state (e.g. due to manufacturing variations/tolerances).

When the read-target CES element 1b is in a HIS, then, as the resistive element 34 is in a LIS the resistance values of the read-target CES 1b and the resistive element 34 are an order of magnitude of resistance apart. Therefore $V_{sense} \approx 0.9999(V_{read})$, which is effectively logic 1, and which is indicative that the read-target CES element 1b is in a HIS.

Alternatively, if the read-target CES element 1 is in a LIS, then, as the resistive element 34 is also in an LIS, the resistance values of the read-target CES element 1b and the resistive element 34 are substantially equal. Therefore, $V_{sense} \approx V_{read}/2$, which is effectively logic '0', and which is indicative that the read-target CES element 1b is in a LIS.

In embodiments, the value of RC, as determined by the column control circuitry 16 may be used to enable or disable the functionality of read control circuitry 24, which, in turn, enables or disables the functionality of the read circuitry 22.

In the present example read control circuitry 24 comprises a transistor, which when enabled, provides a path to ground for the components of the read circuitry 22 for one or more signal lines. In some examples, the read control circuitry 24 may be provided on a per-signal line basis, whereby the read-circuitry 22 for a particular signal line may be enabled or disabled appropriately. In other examples, the read control circuitry 24 may be arranged so as to enable the read circuitry for all, or a particular number, of signal lines.

Figure 5:
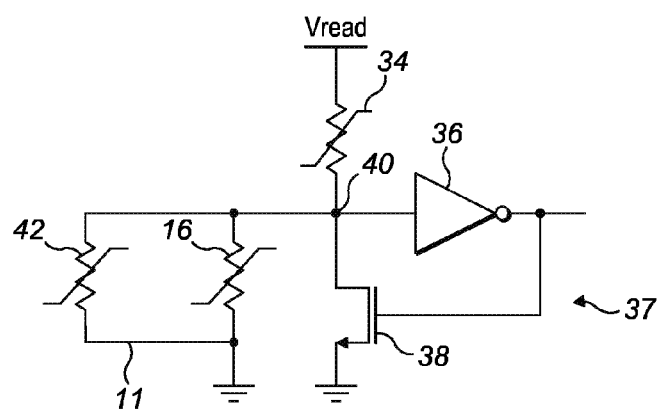
FIG. 5 is a schematic diagram showing an example equivalent circuit for a plurality of correlated electron switches of the cross-point memory array of FIG. 2 according to an embodiment.

FIG. 5 is a schematic diagram showing an example equivalent circuit 37 for a plurality of CES elements of the cross-point memory array 11 according to an embodiment.

Whilst the row lines $R_n$ and column lines $C_n$ of the non-read-target CES elements are controlled to prevent current flow therethrough, because of the connected arrangement of the array, parasitic sneak paths may nonetheless form through one or more of the non-read-target CES elements, which may affect the value of $V_{sense}$, which may, in turn impact on detection of the memory state by the read circuitry 22.

In the equivalent circuit of FIG. 5, CES elements in the parasitic sneak paths, hereinafter "parasitic CES elements" 42 are depicted as elements in parallel with the read-target CES element 1b.

In the present example, the additional sensing circuitry, which comprises the feedback loop including the inverter 36 and transistor 38, reduces the effect such parasitic sneak paths may otherwise have on $V_{sense}$ when detecting the memory state. In the present example the inverter 36 comprises a p-skew inverter 36, whilst the transistor comprises an NMOS transistor 38.

As depicted in FIG. 5, and as above, when the read-target CES element 1b is in a LIS, then $V_{sense} V_{read}/2$. However $V_{sense}$ may be less than $V_{read}/2$ depending on the value of the parasitic CES elements 42.

$V_{sense}$ is input into the inverter logic as $V_{inv-in}$, such that the output of the inverter logic $V_{inv-out} > V_{inv-in}$ (e.g. $3V_{read}/2$), whereby $V_{inv-out}$ is used to drive the gate of the NMOS transistor 38.

When $V_{inv-out}$>than the threshold voltage $V_{threshold}$ of the transistor 38, the transistor 38 will turn on.

When the NMOS transistor is turned on, due to a voltage drop, the value $V_{sense}$ reduces to a feedback voltage $V_{feedback}$, whereby $V_{feedback} < V_{sense}$.

$V_{feedback}$ is then used as $V_{inv-in}$, which is inverted and whereby $V_{inv-out}$ drives the NMOS transistor.

It will be seen, therefore, that such feedback will continue until $V_{sense} \approx 0$, at which point $V_{inv-out}$=logic '1', which is indicative that the read-target CES element 1b is in a LIS.

As above, when the read-target CES element 1b is in a HIS, then $V_{sense} \approx 0.9999(V_{read})$.

However $V_{sense}$ may be less than $0.9999(V_{read})$ depending on the value of the parasitic CES elements 42.

For example, taking an example of a circuit whereby the read-target CES element is in a HIS and the parasitic CES elements 42 comprise three CES elements in a LIS, then $V_{sense} \approx 0.75 V_{read}$.

In this example, when $V_{sense} = V_{inv-in}$, then $V_{inv-out}$ will be evaluated as logic '1', which is indicative that the read-target CES element 1b is in a HIS.

It will be understood that whilst the additional sensing circuitry comprises a feedback loop including an inverter and a transistor, any suitable circuitry or logic may be provided to provide the same functionality.

The parasitic sneak paths may also affect the write operation, whereby the memory states of non-write-target CES elements may be inadvertently changed when a write-target CES is been addressed with a programming signal.

Figure 6:
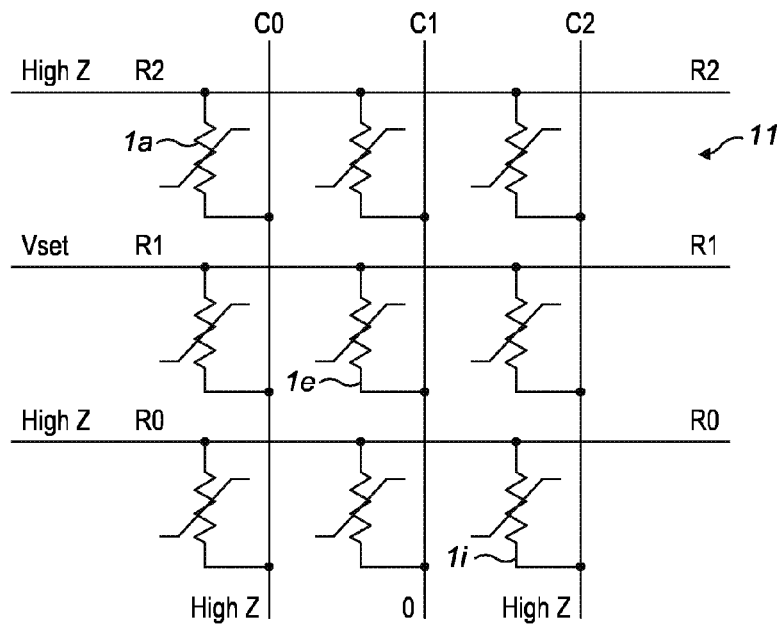
FIG. 6 is a schematic diagram showing the cross-point memory array of FIG. 2 according to an embodiment.
Figure 7:
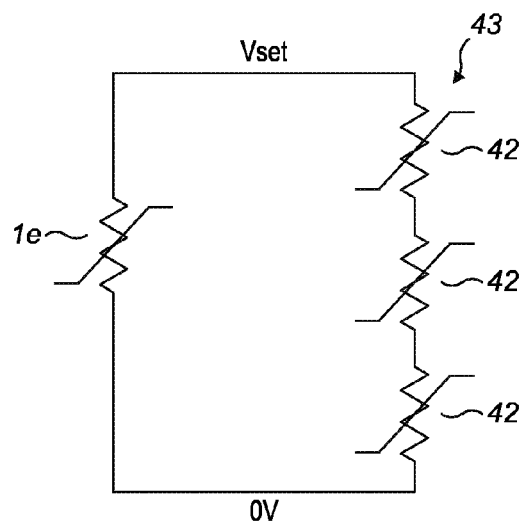
FIG. 7 is a schematic diagram showing an example equivalent circuit for a plurality of correlated electron switches of the cross-point memory array of FIG. 2 according to an embodiment.

FIG. 6 is a schematic diagram showing the cross-point memory array 11 comprising CES elements 1a-1i arranged therein according to an embodiment; and FIG. 7 is a schematic diagram showing an example equivalent circuit 43 for four of the CES elements of the cross-point memory array 11 according to an embodiment.

As will be appreciated, the CES elements 1a-1i may be written to and read from using the control circuitry as previously described, whereby row and column circuitry drive the different signal lines with a programming signal $V_{set}$(at $J_{set}$) when a LIS state is being written into a write-target CES element, whilst the different signal lines are driven with a programming signal $V_{reset}$(at $J_{set}$) when a HIS state is being written into a write-target CES element.

In FIG. 6, the write operation is depicted in the context of CES element 1e being the write-target CES element.

As above, to drive CES element 1e, the column control circuitry (not shown) controls column line $C_1$, which in this example is pulled to 0.

However, due to the fully connected nature of the cross-point array, when the programming signal is driven onto write-target CES element 1e, parasitic sneaks paths may form through the non-write-target CES elements (i.e. 1a-1d & 1f-1i).

When sufficient voltage is applied to and sufficient current density driven through the parasitic CES elements, then the memory state thereof may change. As such, the parasitic sneak paths may affect the memory states of the parasitic CES elements, which, as will be appreciated, should be avoided.

Therefore, in embodiments, when driving a programming signal to a write-target CES element, the signal lines of the non-target CES elements are controlled so have a high impedance thereon such that the voltage applied to, and the current density through the parasitic CES elements 42 is not sufficient to change a memory state thereof.

For example, looking at the equivalent circuit of FIG. 7, the write-target CES element 1e is depicted as being arranged in parallel with three parasitic CES elements 42 which are arranged in series with each other.

When at least two of the parasitic elements 42 are in a HIS, the high impedance will dominate and the voltage drop across the HIS elements will drop to approximately $V_{set}/2$, whereby $V_{set}/2<V_{set}$. Therefore, the voltage across the parasitic elements 42 will be insufficient to effect a memory state change from the HIS to a LIS.

As a further example, when all the parasitic elements 42 are in a LIS, the voltage across each parasitic CES element 42 will be approximately $V_{set}/3$, whereby $V_{set}/3<V_{reset}$. Therefore, the voltage across the parasitic elements in the LIS will be insufficient to effect a memory state change from the LIS to a HIS.

As a further example, when one of the parasitic elements 42 is in a HIS, and two parasitic elements are in a LIS, most of the voltage drop will occur across parasitic CES element 42 in the HIS, thus satisfying the voltage requirement to change memory state thereof from HIS to LIS.

However, the current required to effect the memory state change from HIS to LIS will cause a large voltage drop across each of the parasitic CES elements in a LIS, thereby effecting a voltage drop across the parasitic CES element in the HIS. Therefore, in this configuration, the current through the LIS parasitic CES elements will prevent the memory state change from HIS to LIS in the HIS parasitic CES element.

Therefore, for a cross-point array configuration, either the voltage or current requirements to the change memory state for the non-write-target CES elements in the array will not be met.

Whilst the effects of parasitic sneak paths in a memory cell may be reduced by using a cross-point array configuration or by using additional components such as the feedback sensing circuitry, the effects of parasitic sneak paths may be further reduced or eliminated by employing additional or alternative control schemes or components.

Figure 8:
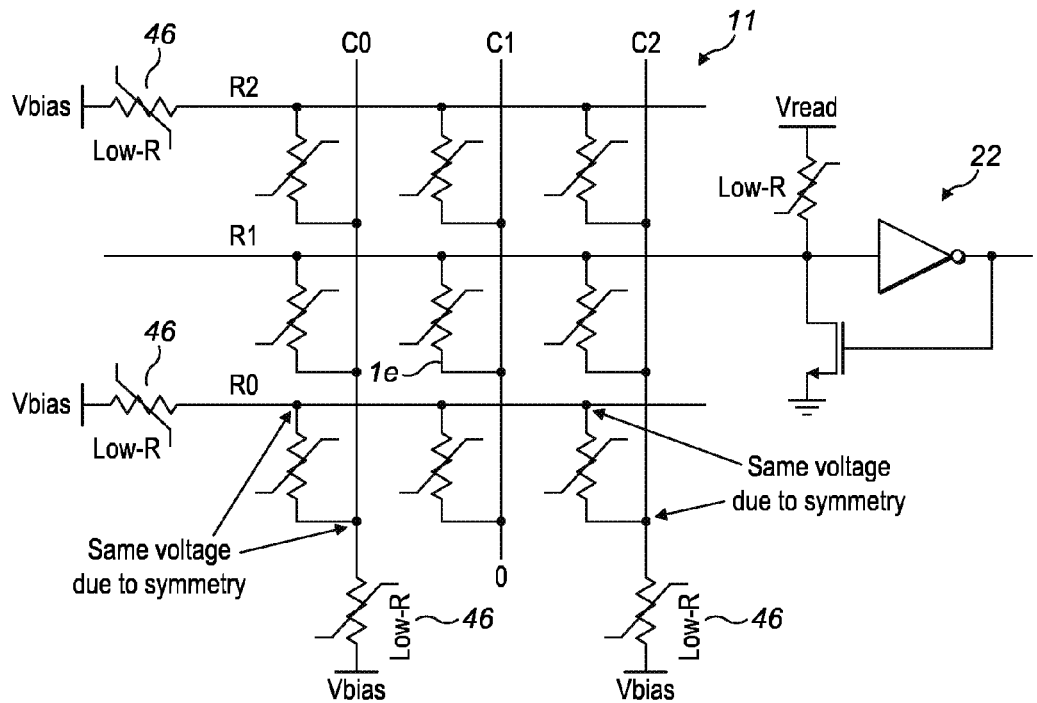
FIG. 8 is a schematic diagram showing components of the control circuitry of FIG. 4 according to a further embodiment.

FIG. 8 is a schematic diagram showing the memory array 11 and components of the read circuitry 22 according to a further embodiment.

In the present embodiment, when performing a read or write operation on a target CES element (depicted as CES element 1e in FIG. 8), the respective signal lines having only non-target CES elements connected thereon have a bias voltage $V_{bias}$ applied thereto such that the first and second terminals of the biased non-target CES elements are at the same potential due to symmetry, thereby preventing the flow of current therethrough.

For example, as depicted in FIG. 8, row lines $R_0$ and $R_2$ and column lines $C_0$ and $C_2$ have a bias voltage $V_{bias}$ applied thereto by connecting the row lines and column lines to biasing resistive elements 46 and a voltage source.

When performing a read operation, $V_{bias}$ is preferably equal to $V_{read}$ as generated by the read circuitry 22 as described previously.

Similarly, when performing a write operation, $V_{bias}$ is preferably equal to the applied voltage e.g. $V_{set}$ or $V_{reset}$.

Connecting biasing resistive elements 46 and $V_{bias}$ to the appropriate row lines $R_n$ and column lines $C_n$ may be controlled by the control circuitry.

In the present example, the biasing resistive element 46 comprises a CES element in a LIS, but may alternatively comprise one or more resistors having a resistance which matches that of the CES elements in the array in a LIS.

By controlling the row lines and column lines of the non-target CES elements to be substantially equipotential, current will not flow through the non-target CES elements thereby reducing or substantially eliminating formation of parasitic sneak paths therethrough, and providing confidence that the target- and non-target CES elements have desired memory states.

Figure 9:
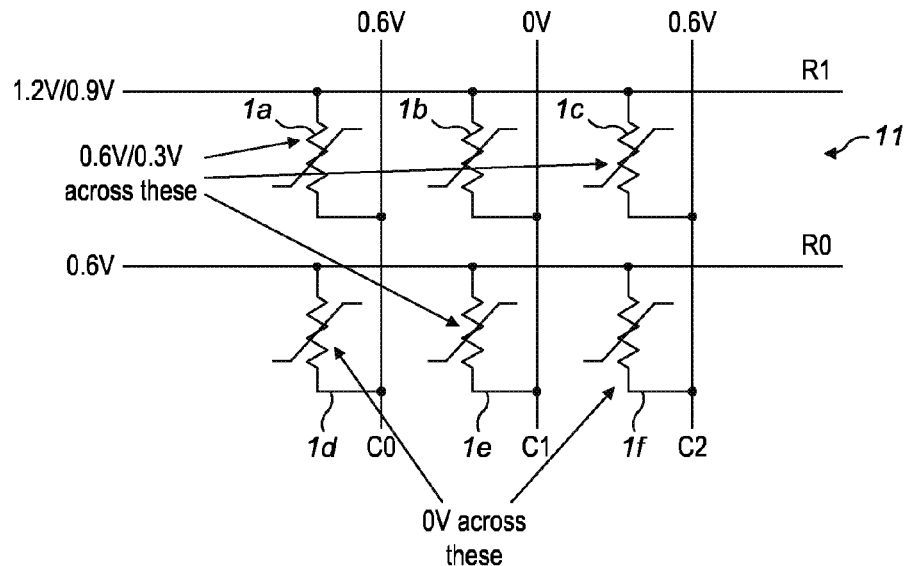
FIG. 9 is a schematic diagram showing the cross-point memory array of FIG. 2 according to a further embodiment.

FIG. 9 is a schematic diagram showing cross-point memory array 11 according to a further embodiment, whereby the bias voltage $V_{bias}$ is greater than 0V such that: $0V<V_{bias}<V_{set}$, and is preferably approximately equal to $V_{set}/2$.

In the present illustrative examples, when NiO is used for the material in the switching region:

$V_{set}\approx1.2V$;

$V_{reset}\approx0.9V$; and $V_{bias}\approx0.6V$

When performing a write operation on a write-target CES element (depicted as 1b in FIG. 9), the corresponding row line $R_1$ is driven at $V_{set}$ 1.2V or $V_{reset}\approx0.9V$ depending on the desired write operation, and similarly the column line $C_1$ is controlled e.g. so as to be at 0V or ground.

By definition, the non-target CES elements on one of the same signal lines as the write-target CES element become biased at half the voltage applied to the write-target CES element, which means the current through the non-target CES elements is reduced by half, thereby reducing the impact of the parasitic paths therethrough.

As the bias across the non-target CES elements on the same row lines and/or column lines as the write-target CES element is less than both $V_{set}$ & $V_{reset}$, then the voltage required to change its memory state from HIS to LIS or vice versa will not be reached during a write operation.

Figure 10:
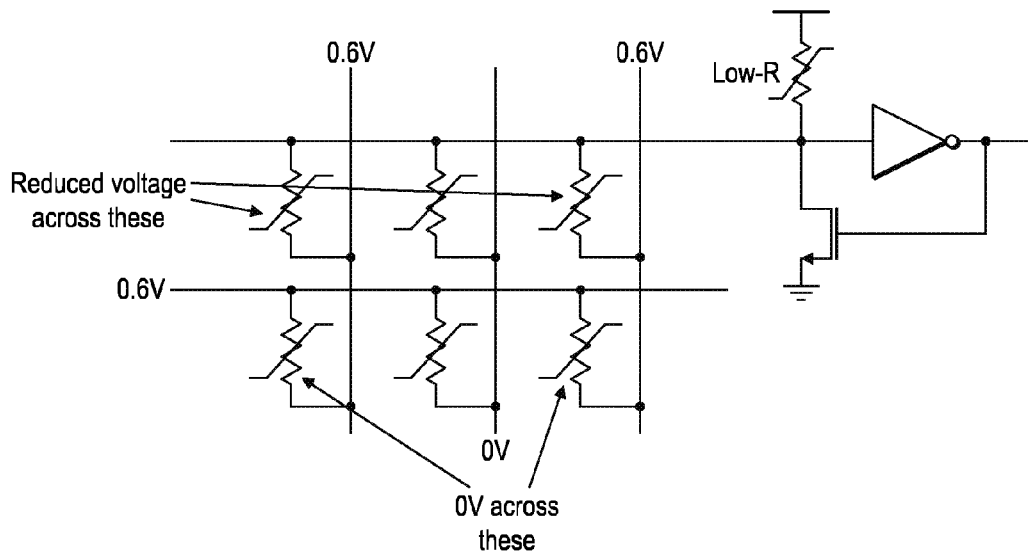
FIG. 10 is a schematic diagram showing the cross-point memory array of FIG. 2 according to a further embodiment.

FIG. 10 is a schematic diagram showing cross-point memory array 11 according to a further embodiment, whereby the bias voltage $V_{bias}$ is greater than 0V such that: $0V<V_{bias}<V_{set}$, and is preferably approximately equal to $V_{set}/2$.

When performing a read operation on a read-target CES element (depicted as 1b in FIG. 10) the corresponding row line $R_1$ is driven at $V_{read}$ 0.3V, and similarly its column line which, along with the other column lines is pre-charged at 0.6V, is driven at 0V. Such a control scheme minimises the parasitic sneak paths on the non-target CES elements provided on different signal lines to the read-target CES element.

Figure 11:
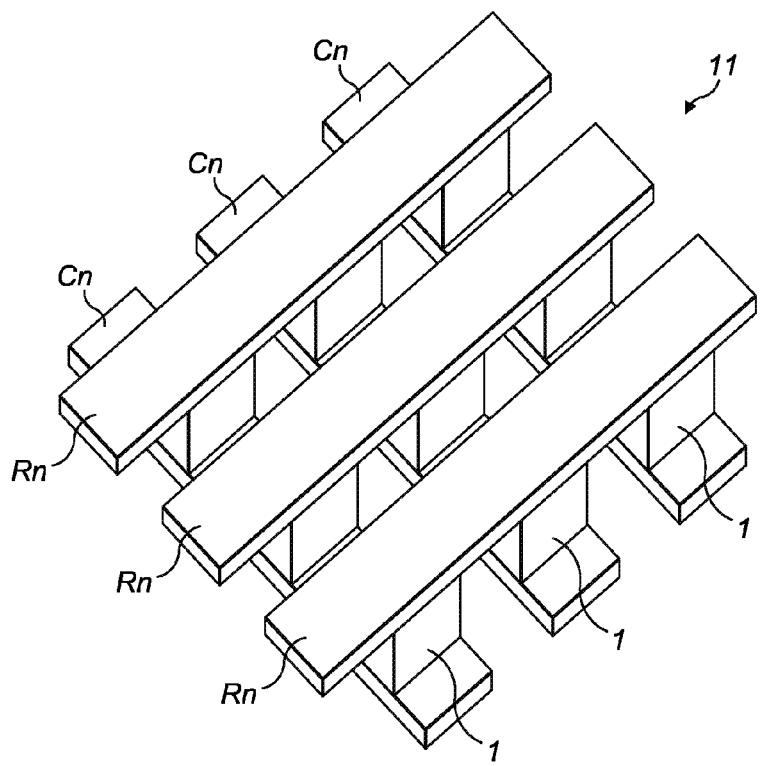
FIG. 11 is a schematic diagram showing the cross-point memory of FIG. 2 in greater detail.

FIG. 11 is a schematic diagram showing memory array 11 having a plurality of first signal lines in the form of row lines ($R_n$) and a plurality of second signal lines in the form of column lines ($C_n$), arranged orthogonal to the row lines ($R_n$) in a cross-point configuration, whereby CES elements 1 are provided at the cross-points between the row lines and column lines. It will be appreciated that whilst not depicted in FIG. 11, the memory array 11 may be stacked in a vertical manner to form multi-layer 3-D memory arrays.

As above, control circuitry may be provided in electrical communication with the signal lines to address target CES elements 1 e.g. to read therefrom to detect a memory state thereof (e.g. with a read-programming signal), and/or write thereto to change a memory state thereof (e.g. with a write-programming signal).

As above, parasitic sneak paths may form during a read or write operation, whereby currents may flow through non-target CES elements, which may change the memory state of the non-target CES elements or affect a signal indicative of a memory state of a read-target CES element, thereby rendering the operation of the memory array unreliable.

In some examples, to reduce or eliminate the parasitic sneak paths, one or more access devices can be provided in the memory array. For example, a diode or transistor can be located between each CES element and the respective signal lines to isolate target CES elements from non-target CES elements by, for example, breaking parallel connections therebetween.

However, it will be appreciated that access devices, being physical devices, may impact the size, operation, cost, & power efficiency of the memory array, or any device which incorporates the memory array.

For example, powering access devices may reduce the power efficiency of the memory array, which may impact the lifetime of the device (e.g. by reducing battery life), or reduce the speed of the memory (e.g. switching access devices on/off).

In other examples, incorporating access devices into a memory array may reduce the space available in the array for CES elements, thereby reducing the memory capacity.

However, as described above, the control circuitry may be configured to drive the respective signal lines with a control scheme (e.g. by controlling the terminals of non-target CES elements to be equipotential), which may reduce or eliminate parasitic sneak paths, thereby negating the requirement for access devices.

Therefore, whilst access devices may be used to minimise the effects of parasitic sneak paths in some embodiments, controlling the signal lines with control schemes as described above to eliminate, or at least reduce, the impact of parasitic paths is more preferable than incorporating access devices into the memory array as the size and operation, cost, & power efficiency of a memory array using such control schemes may be improved in comparison to memory arrays which also include access devices. However, it will be understood that the control schemes described herein could also be used with memory arrays having access devices therein.

Figure 12:
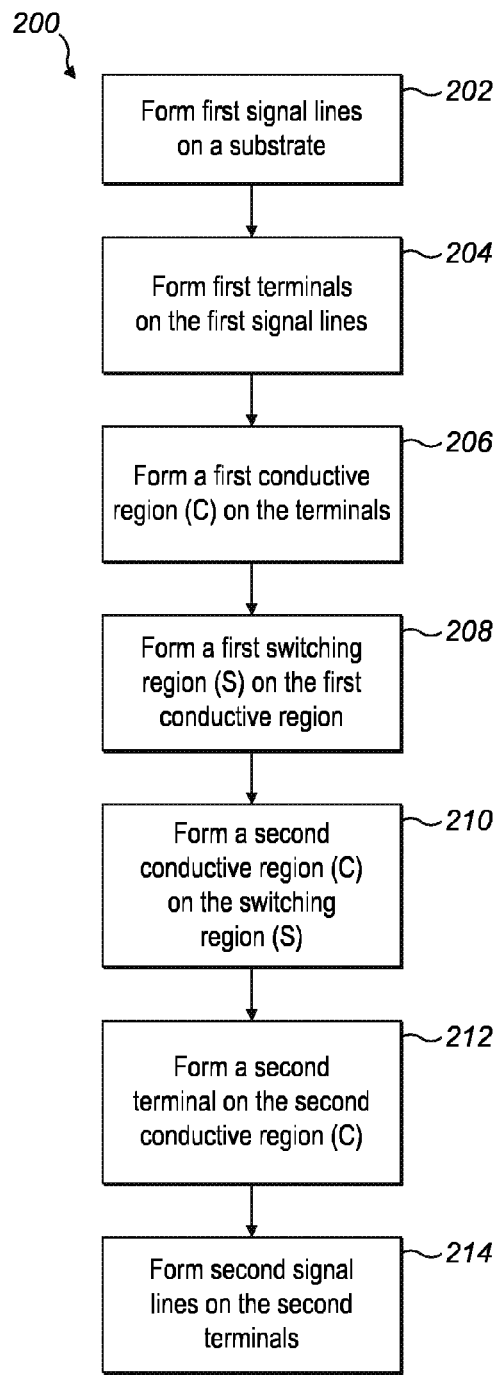
FIG. 12 illustrates a flowchart for forming the cross-point memory array of FIG. 11 according to some embodiments.

FIG. 12 illustrates a flowchart 200 for forming a memory array according to some embodiments.

The described flowchart is a general description of techniques used to form a memory array as described above. The flowchart describes techniques for forming a cross-point memory array including signal lines having CES elements provided at the cross-points. Although certain processing techniques and specifications are described, it is understood that various other techniques and modifications of the techniques described herein may also be used.

Furthermore, any suitable selective deposition techniques may be used to fabricate the memory array, e.g. growing materials or by blanket deposition or targeted deposition of material(s) on the surface of a substrate such as by physical vapour deposition (PVD), spin coating, atomic layer deposition (ALD), sputtering, chemical vapour deposition (CVD) or Plasma enhanced CVD (PECVD) to deposit the required material and using a suitable material removal process (e.g. wet chemical etching, ion etching) features/shapes.

While not shown for clarity and ease of illustration, it will be understood that the memory array may be formed over a substrate, which can include, among other things, various peripheral and supporting component and circuitry, for instance CMOS transistors, diodes, vias etc. that may form a part of the control circuitry. As used herein, the term "substrate" may include a bulk semiconductor substrate as well as integrated structures formed thereover.

At Step 202, a plurality of first signal lines are provided on a substrate, whereby in the present embodiment the first signal lines comprise substantially parallel lines.

The first signal lines (and second signal lines below) may comprise any conductive and/or semiconductive material suitable for carrying electrical current for accessing the CES elements within the memory array. Examples of conductive/semiconductive materials suitable for forming signal lines include n-doped or p-doped polysilicon; metals including Al, Cu, and W; conductive metal nitrides including TiN, TaN, and TaCN; and other conductive materials.

At Step 204, a first terminal material of the respective CES elements is deposited on the first signal lines at the proposed respective cross-points between the first signal lines and second signal lines (as described at Step 214).

The first terminal material may comprise any conductive and/or semiconductive material suitable to conduct electrical current. Examples of conductive/semiconductive materials include doped polysilicon; metals including Al, Cu, and W; conductive metal nitrides including TiN, TaN, and TaCN; and other conductive materials.

At Step 206, a first conductive region material of the respective CES elements is deposited on the first terminal material.

In the present example, the conductive region may comprise any suitable material, and may comprise a transition metal oxide, and may further include any material comprising metal-like characteristics, including, for example, polysilicon or a doped semiconductor. In embodiments, the conductive region may additionally or alternatively comprise a material selected from a group comprising aluminium, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

At Step 208, a switching region material of the respective CES elements is deposited on the first conductive region material.

According to an embodiment, the switching region (S) may comprise any transition metal oxide (TMO) material, such as, for example, perovskites, Mott insulators, charge exchange insulators, and Anderson disorder insulators as previously discussed.

At Step 210, a second conductive region material of the respective CES elements is deposited on the switching region material.

In the present example the second conductive region material is the same as the first conductive region material as described above.

At Step 212, a second terminal material of the respective CES elements is deposited on the second conductive region material.

In the present example the second terminal material is the same as the first terminal material as described above.

At Step 214, second signal lines are deposited on the second terminal material of the respective CES elements, whereby the second signal lines are deposited orthogonal to the first signal lines to form a cross-point array.

In the present example the second signal lines comprise the same material as the first signal lines as described above.

It will be appreciated that in embodiments where one or both of the terminals of the CES element is omitted, one or both of the signal lines may serve as the terminals in addition to carrying electrical signals.

Furthermore, in some embodiments, it will be appreciated that materials for an access device may be provided between the CES elements and the first or second signal lines, but as above, the requirement of such access devices to reduce, or eliminate, parasitic sneak paths may be negated due to control schemes as discussed above.

The term "program" is used interchangeably herein with the term "write" or "re-write". The term "erase" is used interchangeably herein with the term "delete", or "clear".

It will be appreciated that whilst $V_{set}$ and $V_{reset}$ are depicted above as being generated from a single source, these voltages could alternatively be generated by a driver or could be driven by the processing core in which the memory device is used e.g. a power pin, dedicated pads, internal circuitry, or a splitter.

Furthermore, whilst the control circuitry is generally depicted as comprising discrete read circuitry and write circuitry for clarity, the control circuitry is not limited to such an arrangement and any suitable configuration may be used.

Applications for cross-point arrays having CES elements as described above include but are not limited to memory applications such as bitmap memory, standard cache memory, register arrays etc.

Embodiments of the present techniques also provide a non-transitory data carrier carrying code which, when implemented on a processor, causes the processor to carry out the methods described herein. The processor may be provided within or coupled to the programming circuit used to program the or each CES element into a particular impedance state.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier—such as a disk, microprocessor, CD- or DVD-ROM, programmed memory such as read-only memory (firmware), or on a data carrier such as an optical or electrical signal carrier. The code may be provided on a carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

Although illustrative embodiments of the disclosure have been described in detail herein with reference to the accompanying drawings, it is to be understood that the disclosure is not limited to those precise embodiments, and that various changes and modifications can be effected therein by one skilled in the art without departing from the scope and spirit of the disclosure as defined by the appended claims.

As will be appreciated from the foregoing specification, techniques are described providing a device comprising a storage array, the storage array comprising at least one correlated electron switch in electrical communication with first and second signal lines, and further comprising control circuitry for driving the correlated electron switch with at least one programming signal.

In embodiments the storage array may comprise a plurality of first signal lines and a plurality of second signal lines, wherein the plurality of first signal lines and plurality of second signal lines are arranged in a cross-point configuration and wherein the device further comprises a plurality of correlated electron switches at the cross-points between the plurality of first signal lines and plurality of second signal lines. In embodiments, an access device may be provided in electrical communication with the respective correlated electron switches and the signal lines.

Furthermore, the control circuitry may comprise write circuitry configured to drive a write-target correlated electron switch of the plurality of correlated electron switches with a write-programming signal to effect a change in the memory state thereof.

Furthermore, the write-programming signal may be controllable by the write circuitry based on a desired memory state of the write-target correlated electron switch.

In embodiments, the write-programming signal may comprise a first write-programming signal when a first memory state is desired to be written to the write-target correlated electron switch, wherein the first write-programming signal may comprise a first voltage value and/or a first current density value.

Furthermore, the write-programming signal may comprise a second write-programming signal when a second memory state is desired to be written to the write-target correlated electron switch, wherein the second write-programming signal may comprise a second voltage value and/or a second current density value.

The device according to any preceding claim, wherein the control circuitry may comprise read circuitry configured to drive a read-target correlated electron switch of the plurality of correlated electron switches with a read-programming signal to detect a memory state of the read-target correlated electron switch, wherein the read programming signal may comprise a first read-voltage value.

Furthermore, the read circuitry may comprise a resistive element, wherein the resistive element is arranged in a resistor ladder configuration with the read-target correlated electron switch to generate a first output value indicative of the memory state of the read-target correlated electron switch, wherein the resistive element may comprise a correlated electron switch in the first memory state.

In embodiments, the read circuitry may comprise a feedback loop configured to generate a second output indicative of the memory state of the read-target correlated electron switch, wherein the feedback loop may comprise an inverter and a transistor, wherein the input to the inverter may be a value indicative of the memory state of the read-target correlated electron switch, and wherein an output of the invertor may be arranged to drive the gate of the transistor.

In embodiments, the control circuitry may be configured to drive one or more non-target correlated electron switches of the plurality of correlated electron switches with a control scheme to control the formation of parasitic sneak paths therethrough, wherein the control scheme may comprise driving one or more of the non-target correlated electron switches with a bias signal to control the bias at the terminals thereof.

In embodiments, the control scheme may further comprise driving one or more of the non-target correlated electron switches causes one of the bias applied across the terminals thereof and the current driven therethrough to be insufficient to effect a change in the memory state thereof when driving the write-programming signal or read-programming signal to the target correlated electron switch.

Furthermore, the control scheme may comprise driving one or more of the non-target correlated electron switches to cause the biases at the first and second terminals thereof to be substantially equipotential when driving the write-programming signal or read-programming signal to the target correlated electron switch.

Techniques are also described for a method of fabricating a storage array having a correlated electron switch, the method comprising selectively depositing first and second conductive materials to form first and second signal lines, and depositing correlated electron material to form the correlated electron switch.

In embodiments, the first signal line may be arranged at an angle with respect to the second signal line to form a cross-point therewith, and wherein the correlated electron switch is formed at the cross-point.

The method may further comprise selectively depositing a third conductive material on the first signal line; selectively depositing correlated electron material on the third conductive material; selectively depositing fourth conductive material on the correlated electron material.

In embodiments, depositing the correlated electron material may comprise: selectively depositing a first conductive correlated electron material on the third conductive material; selectively depositing a first switching correlated electron material on the first conductive correlated electron material; selectively depositing a second conductive correlated electron material on the first switching region and may further comprise selectively depositing a first switching correlated electron material on the third conductive material.

The method may further comprise forming an access device between the correlated electron switch and the first or second signal lines. Techniques are also described for a storage array comprising: first signal lines; second signal lines, a plurality of correlated electron switches provided at cross-points between the signal lines, wherein the memory state of a target correlated electron switch of the plurality of correlated electron switches may be controllable or detectable by a programming signal.

In embodiments the memory state of the target correlated electron switch may be controllable by the programming signal to be in one of a high-impedance memory state and a low-impedance memory state.

Furthermore, the correlated electron switches may be arranged in the storage array such that on application of the programming signal to the target correlated electron switch, the bias across terminals of any non-target correlated switch or the current driven through any non-target correlated electron switch may be insufficient to affect the memory state of any non-target correlated electron switch.

Furthermore, the correlated electron switches may be arranged in the storage array such that on application of the programming signal to the target correlated electron switch, the bias across terminals of any non-target correlated switch may be controllable to be less than the bias across the terminals of the target correlated switch.

In embodiments the correlated electron switches may be arranged in the storage array such that on application of the programming signal to the target correlated electron switch, the bias at a first terminal of a non-target correlated switch may be controlled to be at substantially the same potential as the bias at a second terminal thereof.

Techniques are also described for a read-circuit for a read-target memory cell in a memory array, wherein the read-circuit may comprise a feedback loop configured to generate a second output value indicative of the memory state based on the first output value.

Accordingly, some aspects and features of the disclosed embodiments are set out in the following numbered items:

1. A device comprising a storage array, the storage array comprising a first signal line and a second signal line, at least one correlated electron switch in electrical communication with the first signal line and the second signal line, and control circuitry for driving the correlated electron switch with at least one programming signal.

2. The device of item 1, wherein the storage array comprises a plurality of first signal lines and a plurality of second signal lines.

3. The device of item 2, wherein the plurality of first signal lines and plurality of second signal lines are arranged in a cross-point configuration.

4. The device of item 3, wherein the device further comprises a plurality of correlated electron switches at the cross-points between the plurality of first signal lines and plurality of second signal lines.

5. The device according to any preceding item, wherein the control circuitry comprises write circuitry configured to drive a write-target correlated electron switch of the plurality of correlated electron switches with a write-programming signal to effect a change in the memory state thereof.

6. The device according to any preceding item wherein the write-programming signal is controllable by the write circuitry based on a desired memory state of the write-target correlated electron switch.

7. The device according to any of items 5 or 6, wherein the write-programming signal comprises a first write-programming signal when a first memory state is desired to be written to the write-target correlated electron switch.

8. The device according to item 7, wherein the first write-programming signal comprises a first voltage value and a first current density value.

9. The device according to any of items 5 to 8, wherein the write-programming signal comprises a second write-programming signal when a second memory state is desired to be written to the write-target correlated electron switch.

10. The device according to item 9, wherein the second write-programming signal comprises a second voltage value and a second current density value.

11. The device according to any preceding item, wherein the control circuitry comprises read circuitry configured to drive a read-target correlated electron switch of the plurality of correlated electron switches with a read-programming signal to detect a memory state of the read-target correlated electron switch.

12. The device according to item 11, wherein the read programming signal comprises a first read-voltage value.

13. The device according to any of items 11 or 12, wherein the read circuitry comprises a resistive element, wherein the resistive element is arranged in a resistor ladder configuration with the read-target correlated electron switch to generate a first output value indicative of the memory state of the read-target correlated electron switch.

14. The device according to item 13, wherein the resistive element comprises a correlated electron switch in the first memory state.

15. The device according to any of items 11 to 14, wherein the read circuitry comprises a feedback loop configured to generate a second output indicative of the memory state of the read-target correlated electron switch.

16. The device according to item 15, wherein the feedback loop comprises an inverter and a transistor, wherein the input to the inverter is a value indicative of the memory state of the read-target correlated electron switch, and wherein an output of the invertor is arranged to drive the gate of the transistor.

17. The device according to any of items 2 to 16, wherein the control circuitry is configured to drive one or more non-target correlated electron switches of the plurality of correlated electron switches with a control scheme to control the formation of parasitic sneak paths therethrough.

18. The device according to item 17, wherein the control scheme comprises driving one or more of the non-target correlated electron switches with a bias signal to control the bias at the terminals thereof.

19. The device according to any of items 17 or 18, wherein the control scheme further comprises driving one or more of the non-target correlated electron switches causes one of the bias applied across the terminals thereof and the current driven therethrough to be insufficient to effect a change in the memory state thereof when driving the write-programming signal or read-programming signal to the target correlated electron switch.

20. The device according to any of items 17 to 19, wherein the control scheme further comprises driving one or more of the non-target correlated electron switches to cause the biases at the first and second terminals thereof to be substantially equipotential when driving the write-programming signal or read-programming signal to the target correlated electron switch.

21. A method of fabricating a storage array having a correlated electron switch, the method comprising: selectively depositing first conductive material to form a first signal line on a substrate; forming the correlated electron switch on the first signal line; selectively depositing second conductive material atop the correlated electron switch to form a second signal line, wherein the correlated electron switch is provided in electrical communication with the first signal line and the second signal line.

22. The method according to item 21, wherein the first signal line is arranged at an angle with respect to the second signal line to form a cross-point therewith, and wherein the correlated electron switch is formed at the cross-point.

23. The method according to any of items 21 and 22, wherein forming the correlated electron switch comprises: selectively depositing third conductive material on the first signal line; selectively depositing correlated electron material on the third conductive material; selectively depositing fourth conductive material on the correlated electron material.

24. The method according to item 23, wherein depositing the correlated electron material comprises: selectively depositing a first conductive correlated electron material on the third conductive material; selectively depositing a first switching correlated electron material on the first conductive correlated electron material; selectively depositing a second conductive correlated electron material on the first switching region.

25. The method according to item 23, wherein depositing the correlated electron material comprises: selectively depositing a first switching correlated electron material on the third conductive material.

26. The method according to any of items 21 to 25, further comprising: forming an access device between the correlated electron switch and the first or second signal lines.

27. A storage array comprising: first signal lines; second signal lines, arranged at an angle with the first signal lines to form cross-points therewith; a plurality of correlated electron switches provided at the cross-points, wherein the correlated electron switches comprises correlated electron material, wherein the correlated electron material comprises a switching region, and wherein the memory state of a target correlated electron switch of the plurality of correlated electron switches is controllable or detectable by a programming signal from a control circuit via one or both of the first and second signal lines.

28. The storage array of item 27, wherein the memory state of the target correlated electron switch is controllable by the programming signal to be in one of a high-impedance memory state and a low-impedance memory state.

29. The storage array of any of items 27 or 28, wherein the correlated electron switches are arranged in the storage array such that on application of the programming signal to the target correlated electron switch, the bias across terminals of any non-target correlated switch or the current driven through any non-target correlated electron switch is insufficient to affect the memory state of any non-target correlated electron switch.

30. The storage array of any of items 27 to 29, wherein the correlated electron switches are arranged in the storage array such that on application of the programming signal to the target correlated electron switch, the bias across terminals of any non-target correlated switch is controllable to be less than the bias across the terminals of the target correlated switch.

31. The storage array of any of items 27 to 30, wherein the correlated electron switches are arranged in the storage array such that on application of the programming signal to the target correlated electron switch, the bias at a first terminal of a non-target correlated switch is controlled to be at substantially the same potential as the bias at a second terminal thereof.

32. A read-circuit for a read-target memory cell in a memory array, the read-circuit comprising a correlated electron switch element in a resistor ladder configuration with the read-target memory cell, wherein the resistor ladder configuration is configured to generate a first output value indicative of the memory state of the read-target memory cell.

33. The read-circuit according to item 32, wherein the read-circuit comprises a feedback loop configured to generate a second output value indicative of the memory state based on the first output value.

34. A device substantially as herein described with reference to the accompanying figures.

35. A method substantially as herein described with reference to the accompanying figures.

36. A storage array substantially as herein described with reference to the accompanying figures.

37. Control circuit substantially as herein described with reference to the accompanying figures.

The invention claimed is:

1. A device comprising a storage array, the storage array comprising:
   a plurality of first signal lines and a plurality of second signal lines arranged in a cross-point configuration;
   a plurality of correlated electron switches in electrical communication with the plurality of first signal lines and the plurality of second signal lines, each cross-point having a respective correlated electron switch therebetween; and
   control circuitry for driving a target correlated electron switch of the plurality of correlated electron switches,
   the control circuitry comprising write circuitry configured to drive a write-target correlated electron switch of the plurality of correlated electron switches with a first write programming signal comprising a first voltage and first current density to place the target correlated electron switch in a low impedance state or a second write programming signal comprising a second voltage and second current density to place the target correlated electron switch in a high impedance state,
   the control circuitry is configured to drive one or more non-target correlated electron switches of the plurality of correlated electron switches with a control scheme to control the formation of parasitic sneak paths therethrough,
   the control circuitry comprises read circuitry configured to drive a read-target correlated electron switch of the plurality of correlated electron switches with a read-programming signal to detect a memory state of the read-target correlated electron switch,
   the read circuitry comprises a correlated electron switch arranged in electrical communication with the plurality of correlated electron switches and arranged in a resistor ladder configuration with the read-target correlated electron switch to generate a first output value indicative of the memory state of the read-target correlated electron switch.

2. The device according to claim 1, wherein the first write-programming signal or the second write programming signal is controllable by the write circuitry based on a desired memory state of the write-target correlated electron switch.

3. The device according to claim 1, wherein the control scheme comprises driving one or more of the non-target correlated electron switches with a bias signal to control a bias at the terminals thereof.

4. The device according to claim 1, wherein the control scheme further comprises driving one or more of the non-target correlated electron switches to cause one of the bias applied across the terminals thereof and the current driven therethrough to be insufficient to effect a change in the memory state thereof when driving the first write-programming signal, second write-programming signal or the read-programming signal to the target correlated electron switch.

5. The device according to claim 1, wherein the control scheme further comprises driving one or more of the non-target correlated electron switches to cause biases at the first and second terminals thereof to be substantially equipotential when driving the first write-programming signal, second write-programming signal or the read-programming signal to the target correlated electron switch.

* * * * *